United States Patent
Hayashi

(10) Patent No.: US 8,704,374 B2
(45) Date of Patent: Apr. 22, 2014

(54) SEMICONDUCTOR DEVICE AND METHOD FOR MANUFACTURING THE SAME

(75) Inventor: Yumi Hayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/428,569

(22) Filed: Mar. 23, 2012

(65) Prior Publication Data

US 2013/0043604 A1    Feb. 21, 2013

(30) Foreign Application Priority Data

Aug. 17, 2011  (JP) .................................. 2011-178468

(51) Int. Cl.
*H01L 23/48*    (2006.01)
*H01L 23/52*    (2006.01)

(52) U.S. Cl.
USPC ............ 257/758; 257/786; 257/211; 438/622

(58) Field of Classification Search
USPC .......... 257/211, 758, 786, E23.168, E21.585; 438/622, 637
See application file for complete search history.

(56) References Cited

U.S. PATENT DOCUMENTS

| 6,287,924 | B1 * | 9/2001 | Chao et al. | 438/300 |
| 6,509,593 | B2 * | 1/2003 | Inoue et al. | 257/295 |
| 2008/0197391 | A1 * | 8/2008 | Dote et al. | 257/295 |

FOREIGN PATENT DOCUMENTS

JP    2008-27978    2/2008

* cited by examiner

*Primary Examiner* — Theresa T Doan
(74) *Attorney, Agent, or Firm* — Oblon, Spivak, McClelland, Maier & Neustadt, L.L.P.

(57) ABSTRACT

According to one embodiment, a semiconductor device includes a first insulating layer provided in a first area and in a second area, a line-and-space-like second insulating layer formed on the first insulating layer provided in the first area, and a third insulating layer formed on the first insulating layer provided in the second area and which is substantially identical to the second insulating layer in height.

16 Claims, 13 Drawing Sheets

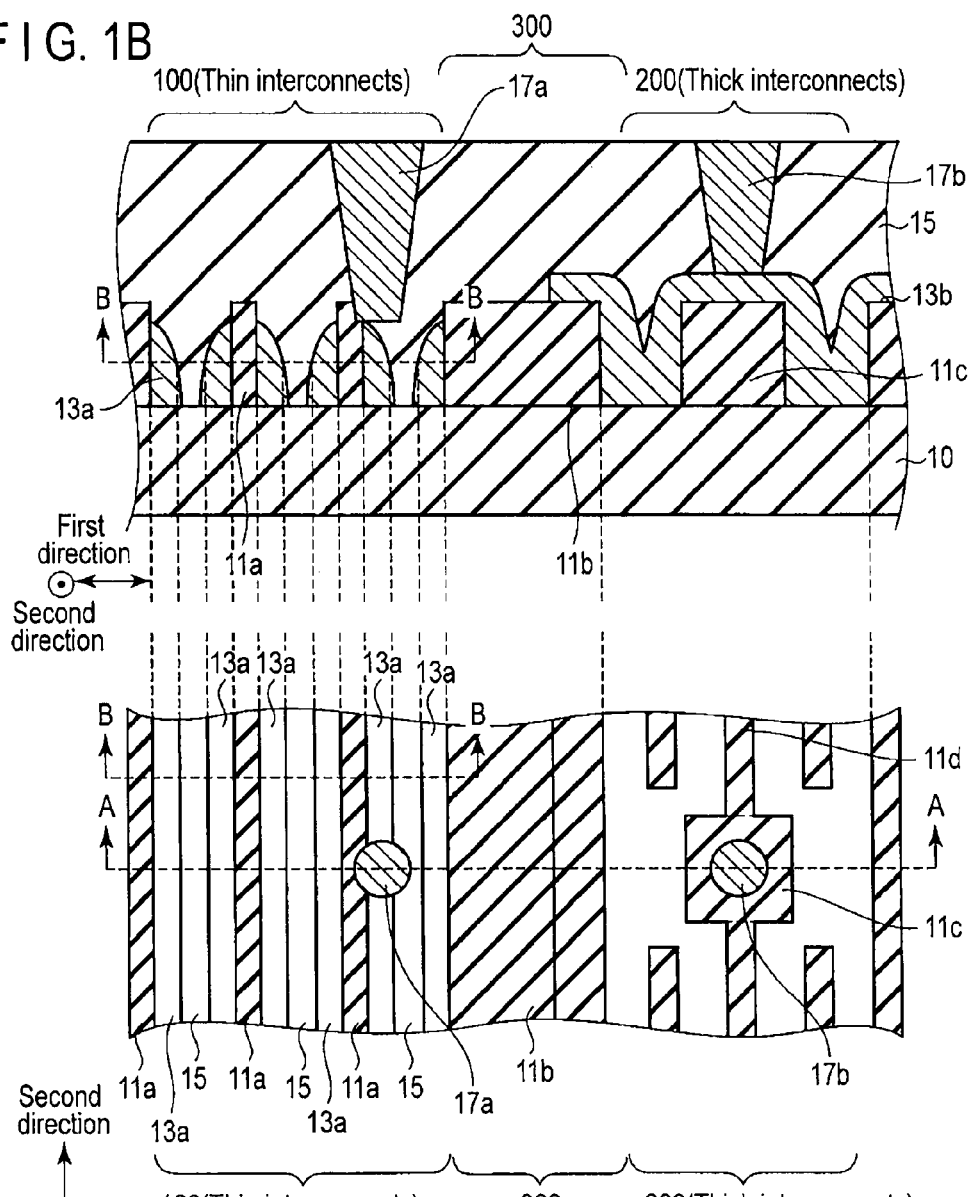

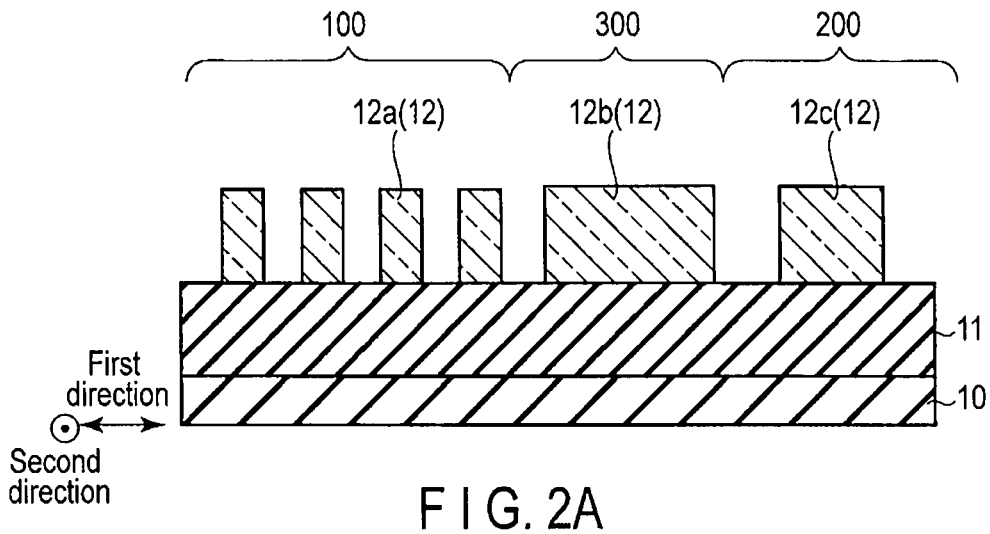
F I G. 2A
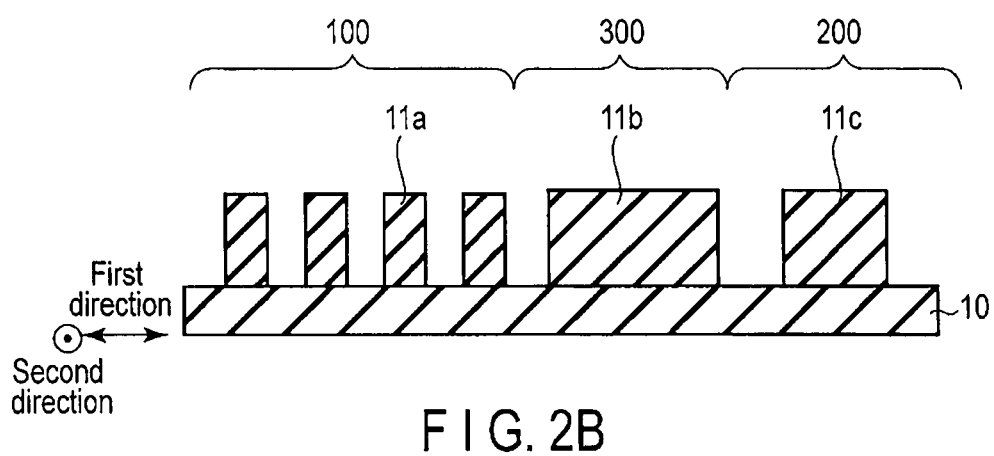
F I G. 2B
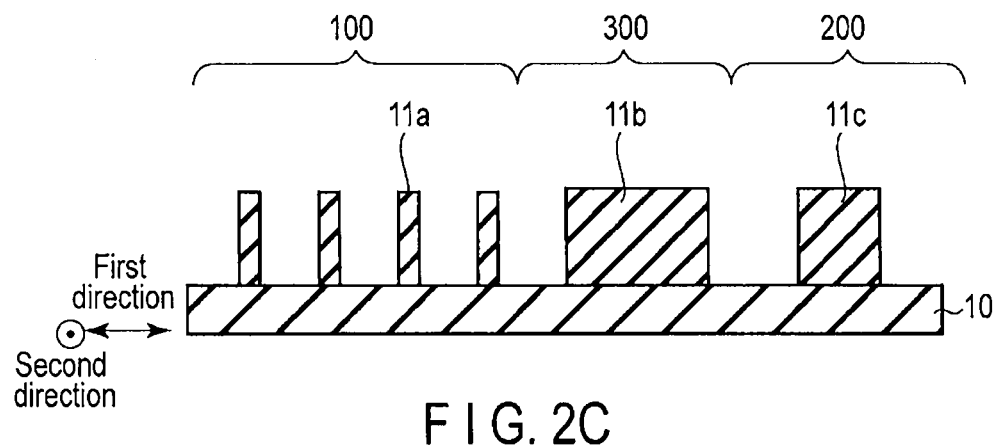
F I G. 2C

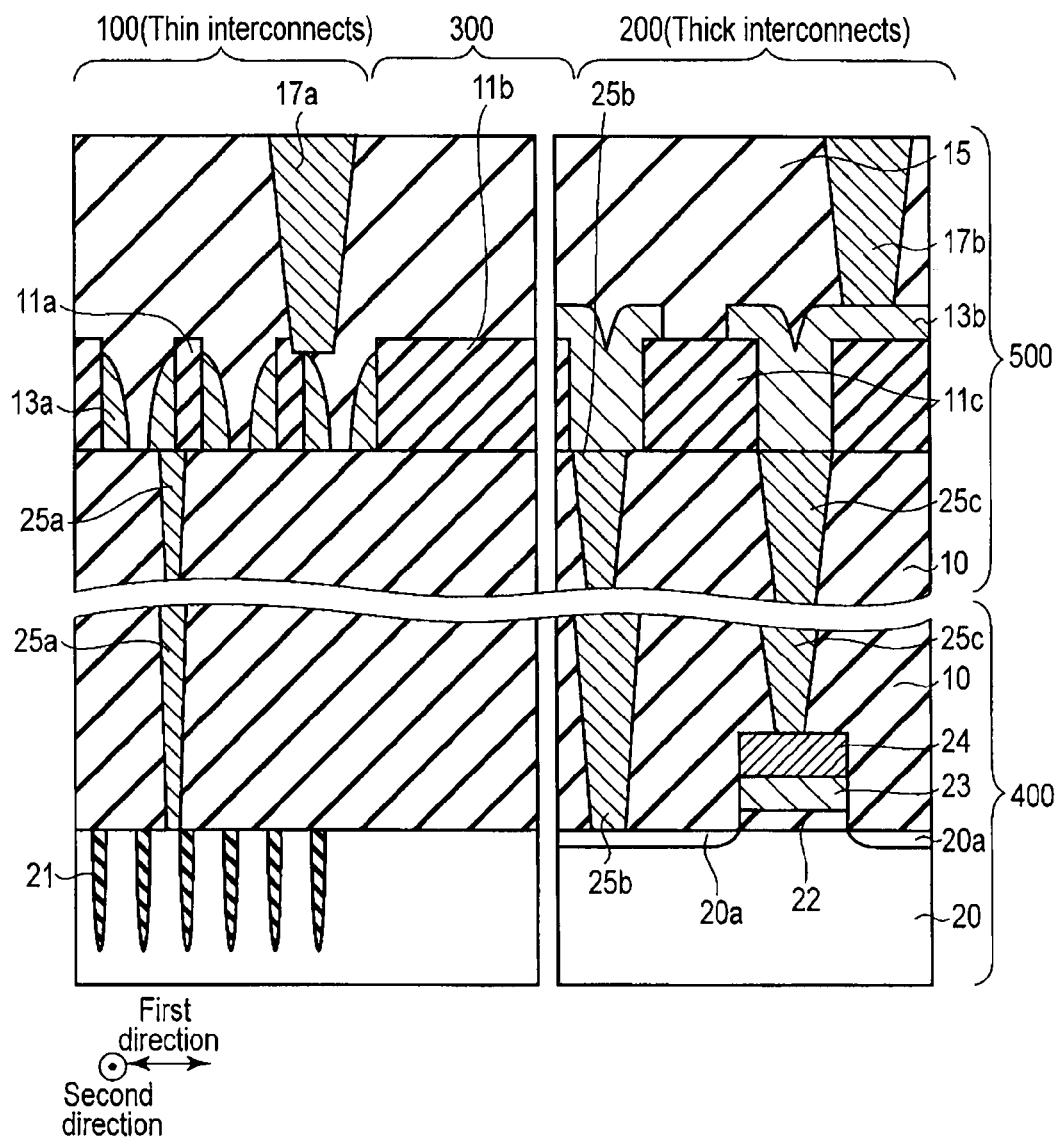
F I G. 9

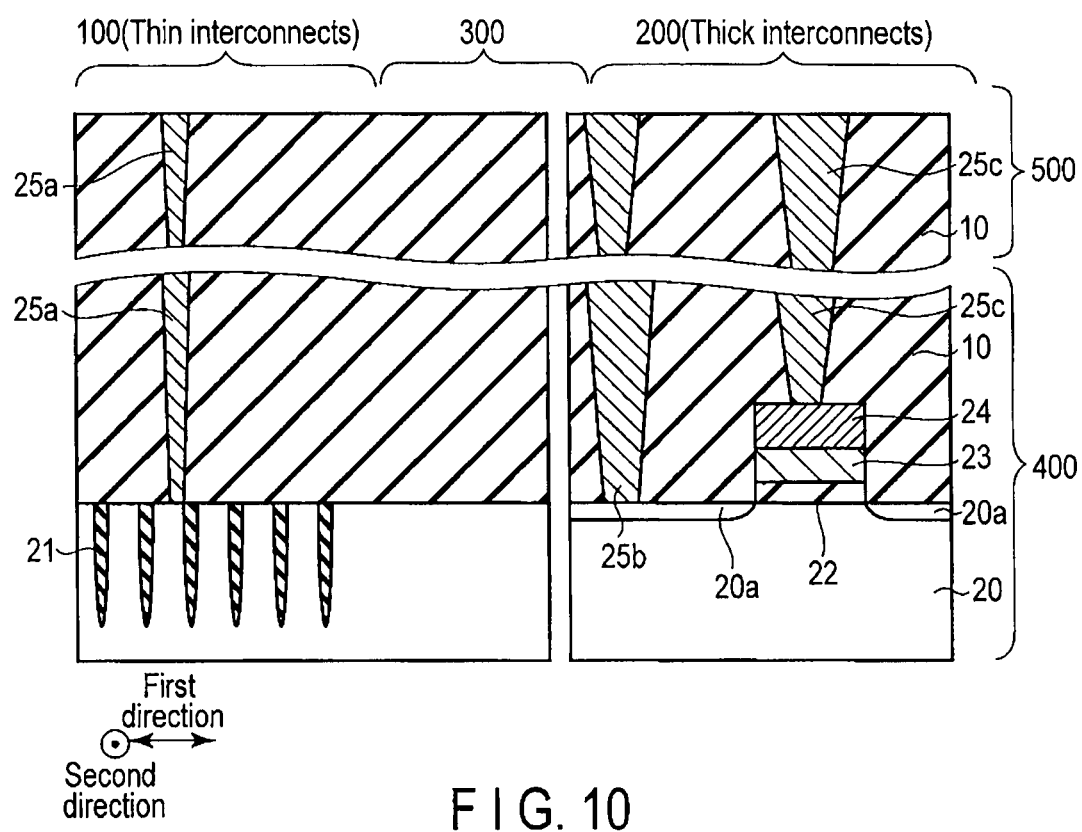
F I G. 10

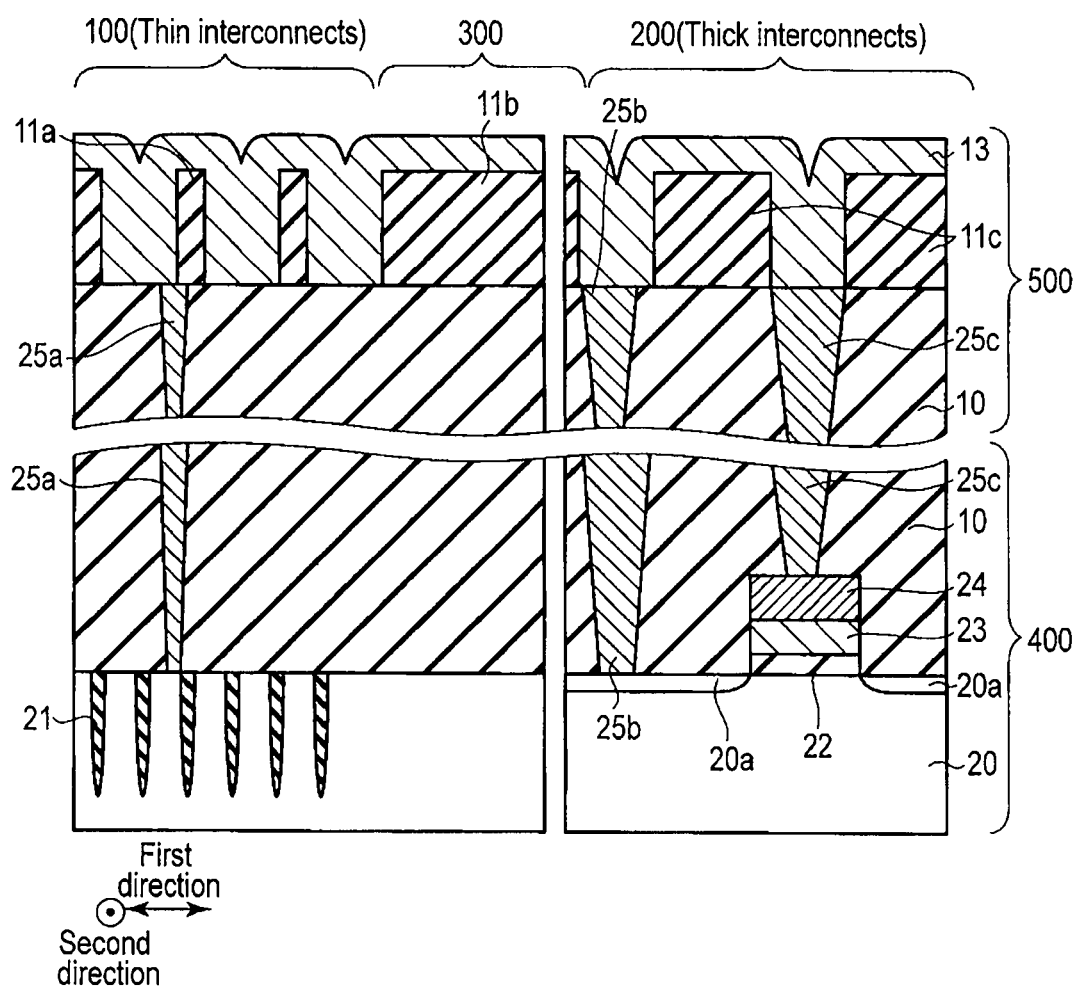
F I G. 11

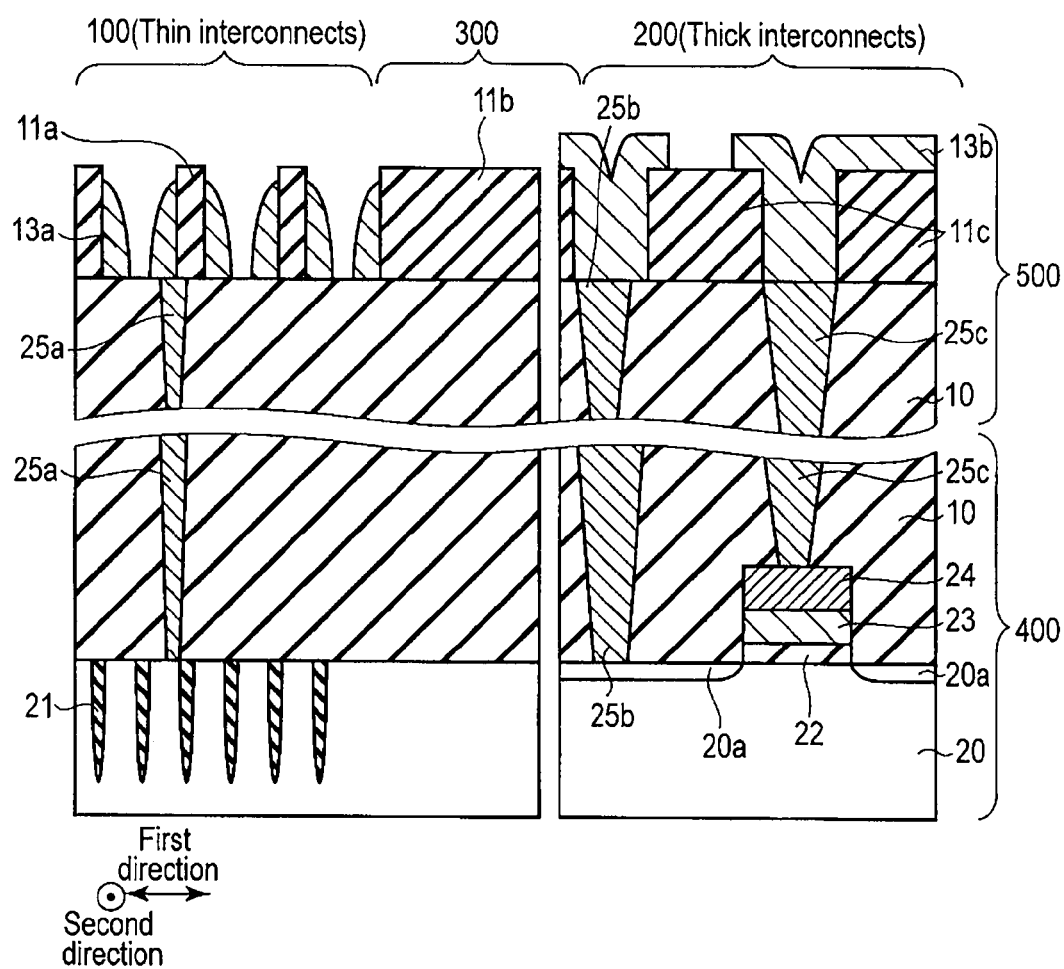
F I G. 12

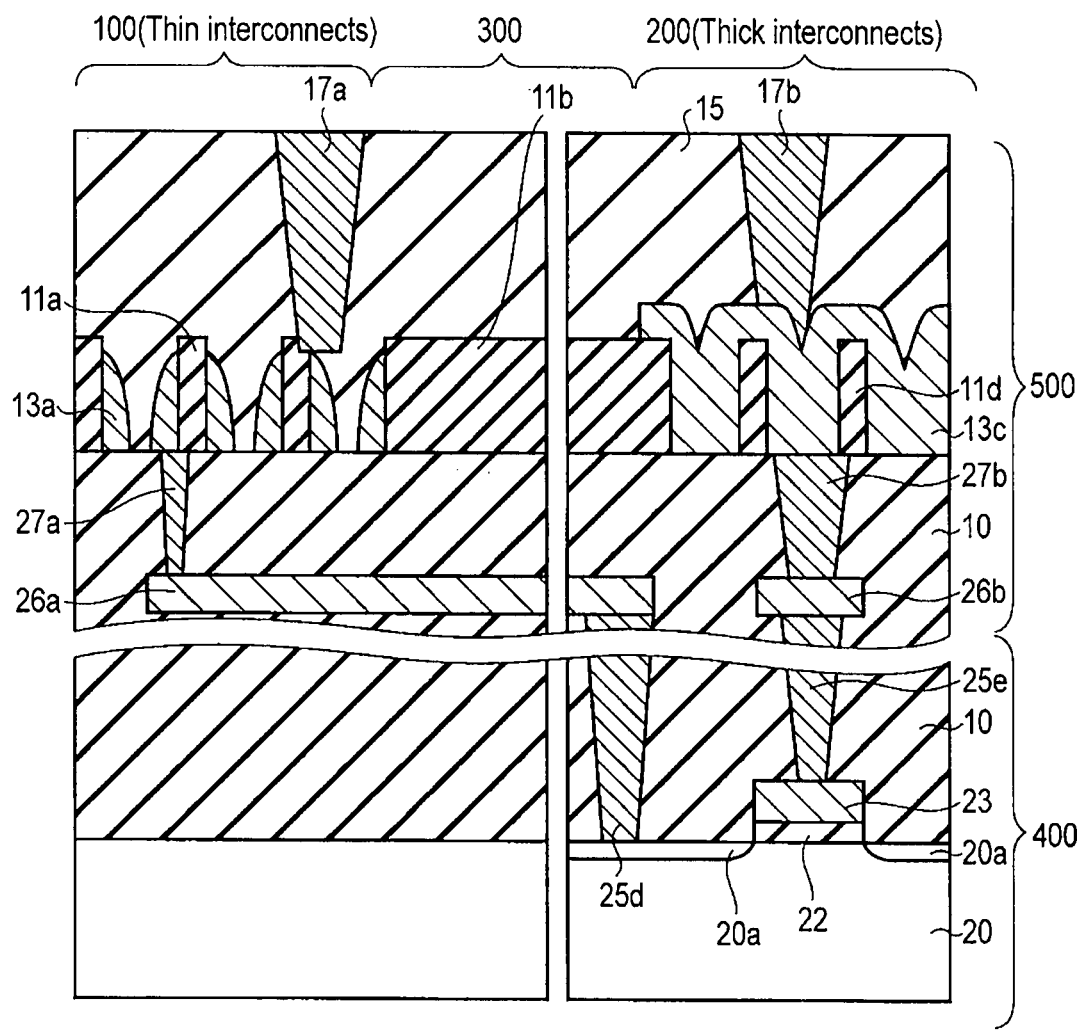
F I G. 13

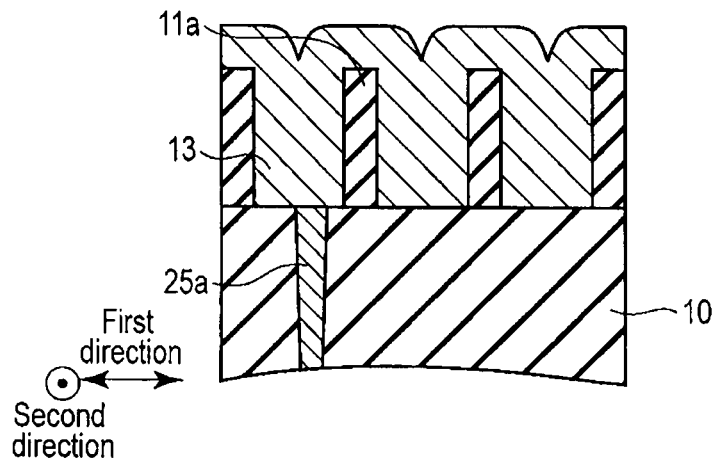
F I G. 15A
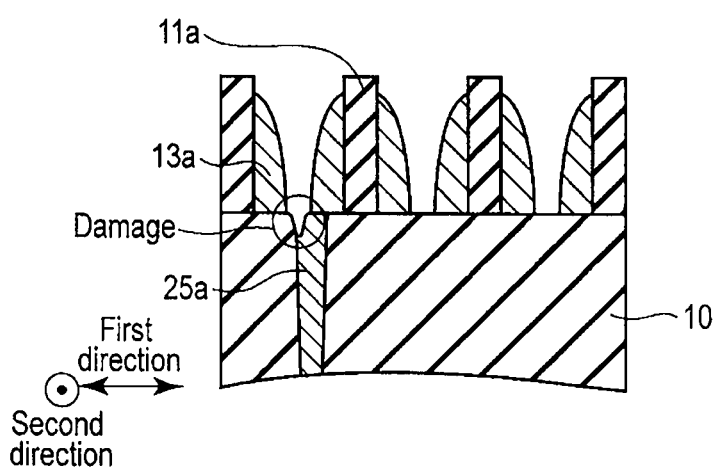
F I G. 15B

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2011-178468, filed Aug. 17, 2011, the entire contents of which are incorporated herein by reference.

FIELD

Embodiments described herein relate generally to a semiconductor device and a method for manufacturing the semiconductor device.

BACKGROUND

In recent years, every effort has been made to miniaturize semiconductor devices, and there has been a demand to form miniaturized interconnects (which may be simply referred to as micro-interconnects). As a method for forming such micro-interconnects, sidewall interconnect techniques (which may be simply referred to as sidewall processing) for forming interconnects on sidewalls of a pattern of an insulating layer are being studied. The use of the sidewall interconnect technique allows a repeated pattern of interconnects to be formed at a pitch half of that for the pattern of the insulating layer. Such sidewall interconnects may be provided in an interconnect area (which may also be referred to as a thin interconnect area) used for a memory cell portion.

For a reduction in the number of manufacturing steps, attempts have been made to simultaneously form such thin interconnect areas and interconnect areas for peripheral circuits and the like in which no micro-interconnects need to be formed (these interconnect areas may also be referred to as thick interconnect areas).

In this case, interconnect materials to be formed into thin interconnects and thick interconnects, respectively, are formed in the same step and are equal in film thickness. On the other hand, in thin interconnect areas, for which the above-described sidewall interconnect technique is used, the interconnect material is formed on the sidewalls of the pattern of the insulating layer. Thus, the height of the interconnects depends on the height of the pattern. In thick interconnect areas, in which no micro-interconnects need to be formed, the height of the interconnects depends on the film thickness of the interconnect material. Hence, the interconnects in the thin interconnect area are higher than those in the thick interconnect area.

As a result, if contact plugs (which may be simply referred to as contacts) are arranged both in the thin interconnect area and in the thick interconnect area, the height of the contact plug varies depending on the interconnect area. This disadvantageously makes the formation of the contact plugs (which may also be referred to as contact processing) more difficult.

Furthermore, the interconnects in the thick interconnect area are desirably thickened in order to reduce interconnect resistance. However, the film thickness of the interconnect material is determined by the line width of sidewall interconnects (half pitch) and the like. This disadvantageously reduces the film thickness of the interconnects in the thick interconnect area, increasing the resistance.

As described above, the formation of semiconductor devices with high quality interconnects has been difficult.

BRIEF DESCRIPTION OF THE DRAWINGS

FIG. 1A is a top view schematically showing a basic configuration of a semiconductor device according to a first embodiment, and FIG. 1B is a cross-sectional view taken along line A-A in FIG. 1A;

FIG. 2A, FIG. 2B, and FIG. 2C are cross-sectional views schematically illustrating a part of a basic method for manufacturing a semiconductor device according to the first embodiment;

FIG. 9 is a cross-sectional view schematically showing a basic configuration of a semiconductor device according to a second embodiment;

FIG. 10 is a cross-sectional view schematically illustrating a part of a basic method for manufacturing a semiconductor device according to the second embodiment;

FIG. 11 is a cross-sectional view schematically illustrating a part of the basic method for manufacturing the semiconductor device according to the second embodiment;

FIG. 12 is a cross-sectional view schematically illustrating a part of the basic method for manufacturing the semiconductor device according to the second embodiment;

FIG. 13 is a cross-sectional view schematically showing a basic configuration of a semiconductor device according to a modification of the second embodiment;

FIG. 15A and FIG. 15B are cross-sectional views schematically showing a basic configuration of a semiconductor device according to a comparative example of the second embodiment.

DETAILED DESCRIPTION

Figure 3A:
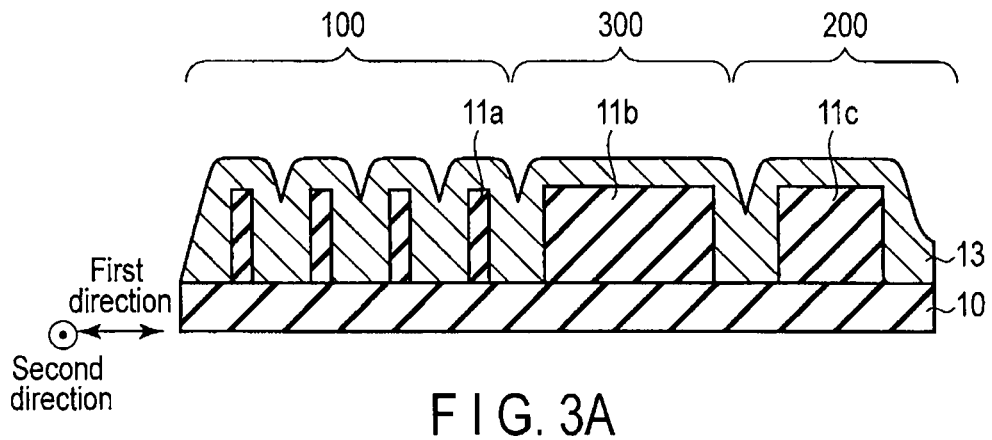
FIG. 3A, FIG. 3B, and FIG. 3C are cross-sectional views schematically illustrating a part of the basic method for manufacturing the semiconductor device according to the first embodiment.

In general, according to one embodiment, a semiconductor device comprises a first insulating layer provided in a first area and in a second area, a line-and-space-like second insulating layer formed on the first insulating layer provided in the first area, and a third insulating layer formed on the first insulating layer provided in the second area and which is substantially identical to the second insulating layer in height. The semiconductor device further comprises a first interconnect layer formed on the first insulating layer provided in the first area and on opposite sidewalls of the second insulating layer, a second interconnect layer formed on the first insulating layer provided in the second area and on a top surface and sidewalls of the third insulating layer, and a fourth insulating layer covering the first insulating layer, the second insulating layer, the first interconnect layer, and the second interconnect layer. The semiconductor device further comprises a first contact plug formed in the fourth insulating layer provided in the first area, the first contact plug being connected to the first interconnect layer, and a second contact plug formed in the fourth insulating layer provided in the second area, the second contact plug being connected to the second interconnect layer.

Embodiments will be described below in detail with reference to the drawings. In the description, common components are denoted by common reference numerals throughout the drawings.

First Embodiment

<Interconnect Configuration>

First, a basic configuration of a semiconductor device according to a first embodiment will be described with reference to FIG. 1A and FIG. 1B. FIG. 1A is a top view schematically showing the basic configuration of the semiconductor device according to the first embodiment. FIG. 1B is a cross-sectional view taken along line A-A in FIG. 1A.

As shown in FIG. 1A and FIG. 1B, the semiconductor device according to the first embodiment comprises a thin interconnect area 100, a thick interconnect area 200, and an area 300. In the thin interconnect area 100 (which may be simply referred to as the area 100), micro-interconnects used for memory cell portions are formed. Specifically, in the area 100, a set of two interconnects of a laterally symmetric structure (the set may also be referred to as sidewall interconnects) is formed on sidewalls of a line-and-space pattern of an insulating layer (the pattern may also be referred to as a repeated pattern). In the thick interconnect area 200 (which may be simply referred to as the area 200), interconnects used for peripheral circuits and the like are formed. The area 300 is, for example, provided between the thin interconnect area 100 and the thick interconnect area, with substantially no active interconnects formed in the area 300.

In the thin interconnect area 100, insulating layers (which may be simply referred to as a pattern) 11a are formed on an insulating layer 10 in a line-and-space pattern so as to extend in a second direction; the insulating layer 11a is about several tens to several hundreds of nanometers in height (film thickness) and about several nanometers to several tens of nanometers in width along a first direction. Furthermore, an interconnect layer 13a is formed on opposite sidewalls of the insulating layer 11a (the sidewalls lie along the direction of extension of the line-and-space pattern). A contact plug (upper layer contact layer) 17a is formed above the interconnect layer 13a. An insulating layer 15 is formed over the insulating layer 10, the insulating layer 11a, and the interconnect layer 13a. The contact plug 17a is formed in the insulating layer 15 and connected to the interconnect layer 13a. As shown at line B-B in FIG. 1A, at a height close to the intermediate between a bottom surface and a top surface of the insulating layer 11a, the insulating layer 11a, the interconnect layer 13a, and portions of the insulating layer 15 which lie between the interconnect layers 13a are substantially the same in width along the first direction.

In the thick interconnect area 200, an insulating layer with a large pattern portion (insulating layer) 11c and a core material portion (insulating layer) 11d is formed on the insulating layer; the large pattern portion 11c is about several tens to several hundreds of nanometers in height and about several tens to several hundreds of nanometers in width on a side and serves as a core material, and the core material portion 11d extends in a second direction. The core material portion 11d is equivalent to, for example, the insulating layer 11c in width along the first direction. Furthermore, an interconnect layer 13b of film thickness about several nanometers to several tens of nanometers is formed on the insulating layer 10 and on sidewalls and top surfaces of the insulating layers 11c and 11d. A contact plug (upper layer contact layer) 17b is formed above the insulating layer 11c and on the interconnect layer 13b. The insulating layer 15 is formed over the interconnect layer 13b. The contact plug 17b is formed in the insulating layer 15 and connected to the interconnect layer 13b. The insulating layers 11c and 11d are substantially the same, in height, as the insulating layer 11a in the thin interconnect area 100. Furthermore, a top surface of the large pattern portion 11c is larger than the area over which the contact plug 17b contacts the interconnect layer 13b. Additionally, the direction of extension of the extending portion 11d is not limited to the second direction.

Furthermore, in the area 300, an insulating layer 11b that is about several tens to several hundreds of nanometers in height is formed on the insulating layer 10. The interconnect layer 13a is formed on a sidewall of the insulating layer 11b which is closer to the thin interconnect area 100. The interconnect layer 13b is formed on a sidewall and a portion of a top surface of the insulating layer 11b which are closer to the thick interconnect area 200. The interconnect layer 13a formed on the sidewall of the insulating layer 11b may be used as a dummy interconnect. The insulating layer 11b is substantially the same, in height, as the insulating layer 11a in the thin interconnect area 100. Additionally, the shape of the insulating layer 11b is not particularly determined, but in the present embodiment, the insulating layer 11b has a large pattern shape in which the insulating layer 11b is larger than the insulating layer 11a in width along the first direction.

The insulting layers 10, 11a, 11b, 11c, 11d, and 15 are an insulating material such as $SiO_2$, SiN, or SiOC. The insulating layers 13a and 13b are a common sidewall interconnect material, for example, TiN, Ti, Ni, Co, W, Mo, Ru, Ta, Al, or barrier metal containing any of these materials. Other examples of the interconnect material include silicides of W, Ti, Ni, Co, Cu, and the like, and doped silicon. A material for the contact plugs 17a and 17b may be any metal that enables damascene, for example, W, Cu, or Al.

<Method for Manufacturing Interconnects>

Now, a basic method for manufacturing a semiconductor device according to the first embodiment will be described with reference to FIGS. 2A, 2B, 2C, 3A, 3B, 3C, and 4. FIGS. 2A, 2B, 2C, 3A, 3B, 3C, and 4 are cross-sectional views schematically illustrating the basic method for manufacturing the semiconductor device according to the first embodiment will.

First, as shown in FIG. 2A, $SiO_2$ is formed into an insulating layer 11 of several tens to several hundreds of nanometers in film thickness on a semiconductor substrate such as an Si substrate (not shown in the drawings), for example, on the insulating layer 10 formed of $SiO_2$. A resist 12 is formed on the insulating layer 11. The resist 12 is then patterned by photolithography. Specifically, the resist 12 is formed into a line-and-space pattern of pitch about several tens of nanometers. At the same time, the resist 12 in the area 200 is patterned into a shape comprising a large pattern portion that is several tens to several hundreds of nanometers in width on a side and a core material portion (not shown in FIGS. 2A, 2B, 2C, 3A, 3B, 3C, and 4) extending in the second direction. Thus, a resist 12a is formed in the area 100, a resist 12c (including the large pattern portion and the core material portion) is formed in the area 200, and a resist 12b is formed in the area 300. The resist 12 may be replaced with a film patterned with the resist.

Then, as shown in FIG. 2B, the insulating layer 11 is etched by a reactive ion etching (RIE) method or the like through the resists 12a, 12b, and 12c as a mask to form insulating layers 11a, 11b, 11c, and 11d (not shown in the drawings). The resists 12a, 12b, and 12c are then removed by ashing or the like.

Then, as shown in FIG. 2C, isotropic etching such as wet etching (which may also be referred to as slimming) is carried out on the insulating layers 11a, 11b, and 11c, for example, until the width of the insulating layer 11a along the first direction is reduced to about half.

Then, as shown in FIG. 3A, for example, W is formed, by a physical vapor deposition (PVD) method or a chemical vapor deposition (CVD) method, into an interconnect layer 13 of about several nanometers to several tens of nanometers in film thickness on the insulating layer 10 and on the top surfaces and sidewalls of the insulating layers 11a, 11b, 11c, and 11d (not shown in FIG. 3A; see FIG. 1A). During deposition of the interconnect material, the deposition method may be adjusted so that the interconnect material is easily deposited on the sidewalls of the insulating layer 11a in the area 100. For example, if the PVD method is used, bias is adjusted during the deposition.

Figure 3B:
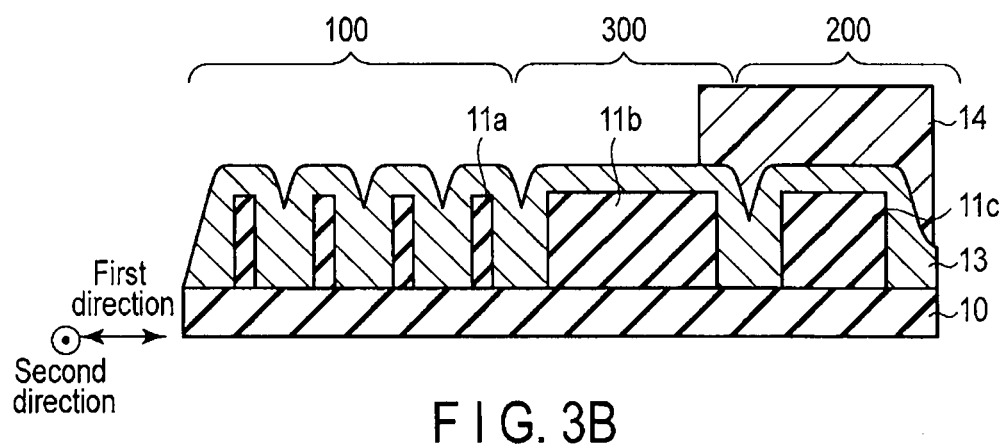

Then, as shown in FIG. 3B, a resist is formed on the interconnect layer 13 and patterned by lithography so as to cover the thick interconnect area 200. Thus, a resist 14 is formed on the interconnect layer 13 in the thick interconnect area 200.

Figure 3C:
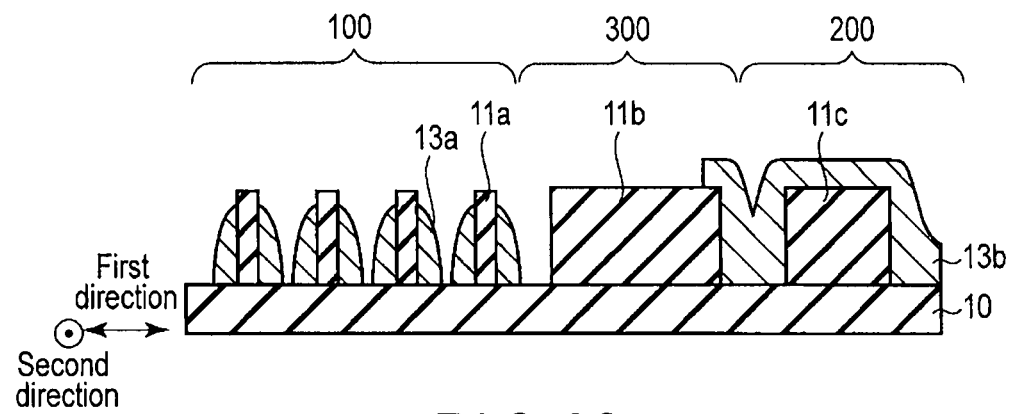

Then, as shown in FIG. 3C, the interconnect layer 13 is etched back by RIE or the like through the resist 14 as a mask. The resist 14 is then removed by ashing or the like. Thus, the interconnect layer 13 is formed on the sidewalls of the insulating layer 11a in the area 100, with the interconnect layer 13b remaining in the area 200. In the area 300, the interconnect layer 13a is formed on the sidewall of the insulating layer 11b which is closer to the area 100, and the interconnect layer 13b is formed on a portion of the top surface and the sidewall of the insulating layer 13b which are closer to the area 200.

Figure 4:
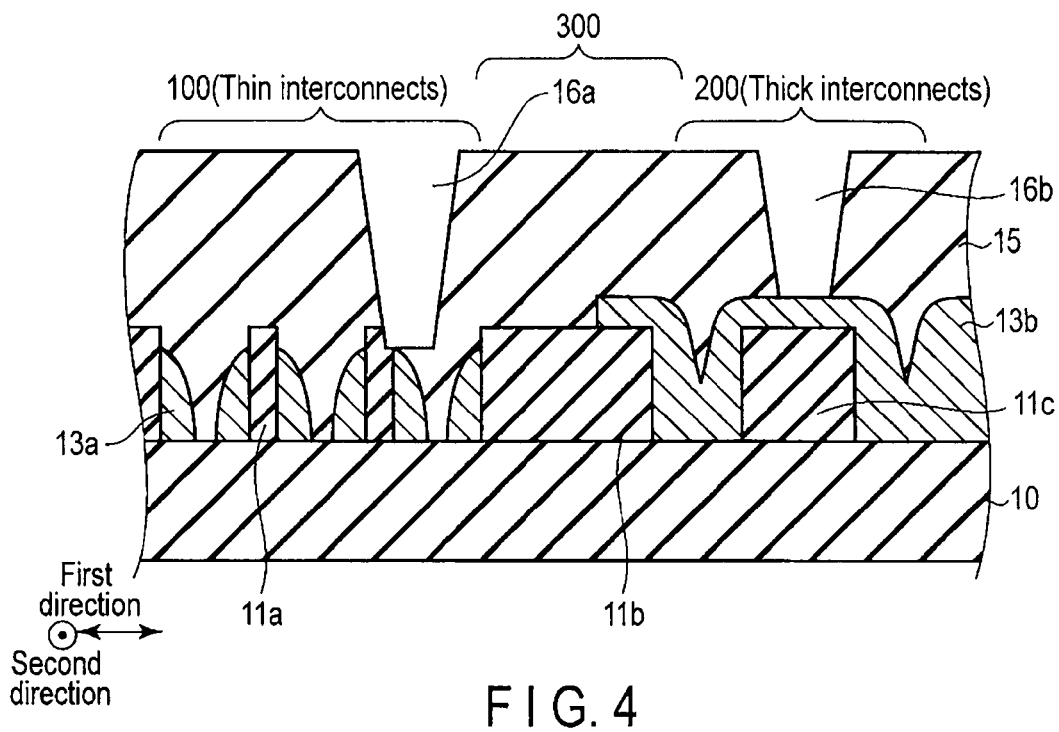
FIG. 4 is a cross-sectional view schematically illustrating a part of the basic method for manufacturing the semiconductor device according to the first embodiment.

Then, as shown in FIG. 4, an insulating layer 15 is formed all over the surface of the resultant structure. In the area 100, the insulating layers 15 and 11a are partly removed by anisotropic etching such as RIE to form a contact hole 16a exposing an upper part of the interconnect layer 13a. Furthermore, in the area 200, the insulating layer 15 is partly removed by anisotropic etching such as RIE to form a contact hole 16b exposing a portion of the interconnect layer 13b which lies over the insulating layer 11c (large pattern). The contact holes 16a and 16b are simultaneously formed. As shown in FIG. 1, metal enabling damascene is buried in each contact hole to form a contact plug 17a in the area 100 and a contact plug 17b in the area 200. Furthermore, compared to the interconnect layer 13a, the interconnect layer 13b is not etched, and thus the top of the etching contact plug 17a is positioned lower than the top of the contact plug 17b.

COMPARATIVE EXAMPLE

Now, a semiconductor device according to a comparative example of the embodiment will be described in brief with reference to FIG. 14.

Figure 14:
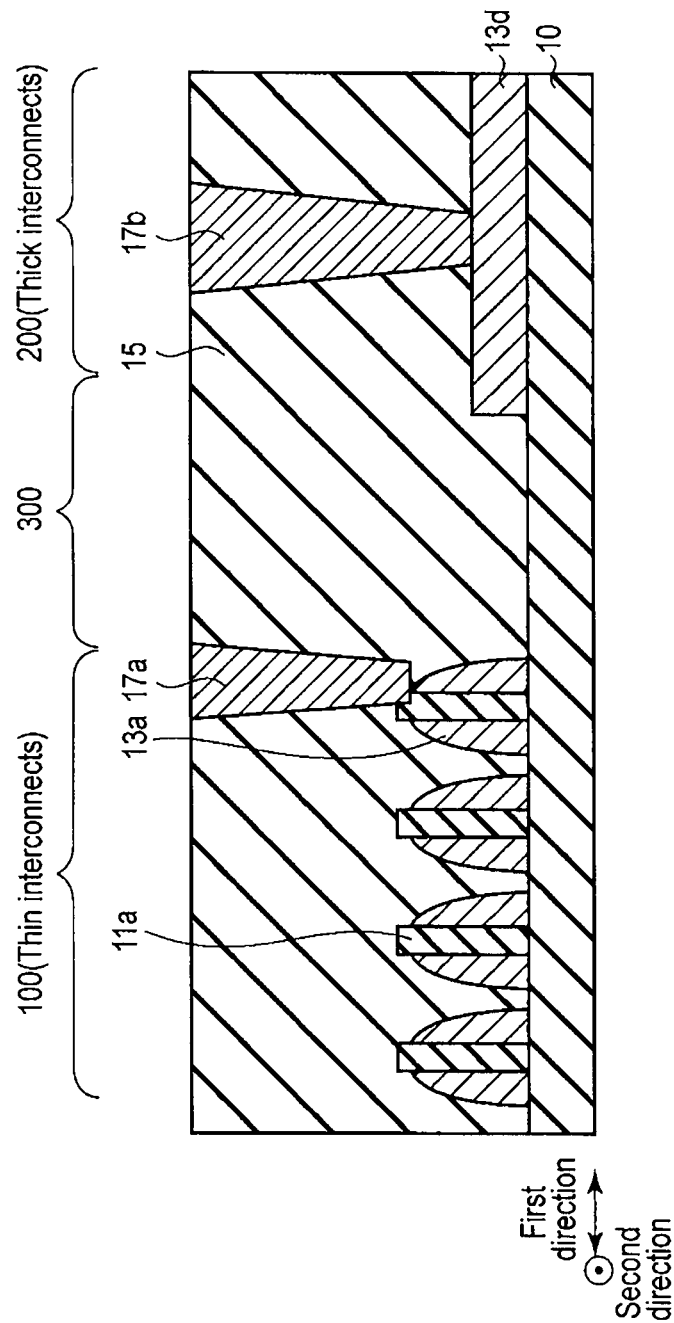
FIG. 14 is a cross-sectional view schematically showing a basic configuration of a semiconductor device according to a comparative example of the first embodiment.

As shown in FIG. 14, the semiconductor device according to the comparative example comprises a thin interconnect area 100, a thick interconnect area 200, and an area 300. In the area 100, sidewall interconnects are formed. In the area 200, interconnects used for peripheral circuits and like are formed. The area 300 is formed between the areas 100 and 200, and no interconnects are formed in the area 300.

In the thin interconnect area 100, insulating layers 11a are formed on an insulating layer 10 in a line-and-space pattern so as to extend in the second direction. Furthermore, an interconnect layer 13a of height several tens to several hundreds of nanometers is formed on each sidewall of the insulating layer 11a. A contact plug 17a is formed above the interconnect layer 13a. An insulating layer 15 is formed over the insulating layer 10, the insulating layer 11a, and the interconnect layer 13a. A contact plug 17a is formed in the insulating layer 15 and connected to the interconnect layer 13a.

In the area 200, an interconnect layer 13d of about several nanometers to several tens of nanometers in film thickness is formed on the insulating layer 10. A contact plug 17b is formed on the interconnect layer 13d. An insulating layer 15 is formed over the interconnect layer 13b.

Furthermore, in the area 300, the insulating layer 15 is formed on the insulating layer 10.

An interconnect layer 13d in the area 200 is formed simultaneously with the interconnect layer 13a in the area 100. Thus, the film thickness of the interconnect layer 13d in the area 200 is determined by, for example, the width of the interconnect layer 13a or the amount by which the interconnect material is etched during the formation of the interconnect layer 13a. In semiconductor devices, which have been increasingly miniaturized, the width of the interconnect layer 13a is desirably smaller, precluding the interconnect layer 13d from having a sufficient film thickness. Hence, the interconnect layer 13a in the area 100, on which the contact plug 17a is formed, is markedly different, in height, from the interconnect layer 13b in the area 200, on which the contact plug 17b is formed. This makes control of etching for forming the contact plugs 17a and 17b difficult.

Furthermore, unlike the areas 100 and 200, the area 300 includes only the insulating layer 15 formed therein. Thus, the surface (not shown in the drawings) of portions of the insulating layer 15 between the areas 100, 200, and 300 may be insufficiently flat.

<Operations and Effects of the Semiconductor Device According to the First Embodiment>

According to the above-described embodiment, the semiconductor device comprises the first insulating layer 10 provided in the first area 100 and in the second area 200, the line-and-space-like second insulating layer 11a formed on the first insulating layer 10 provided in the first area 100, and the third insulating layer 11c formed on the first insulating layer 10 provided in the second area 200 and which is substantially the same as the second insulating layer in height. The semiconductor device further comprises the first interconnect layer 13a formed on the first insulating layer 10 provided in the first area 100 and on the sidewalls of the second insulating layer 11a, and the second interconnect layer 13b formed on the first insulating layer 10 provided in the second area 200 and on the top surface and sidewalls of the third insulating layer 11c. The semiconductor device further comprises the fourth insulating layer 15 covering the first insulating layer 10, the second insulating layer 11a, the first interconnect layer 13a, and the second interconnect layer 13b, the first contact plug 17a formed in the fourth insulating layer 15 provided in the first area 100, the first contact plug 17a being connected to the first interconnect layer 13a, and the second contact plug 17b formed in the fourth insulating layer 15 provided in the second area 200, the second contact 17b plug being connected to the second interconnect layer 13b. The third insulating layer 11c comprises the pattern (large pattern portion) that is larger than the area over which the second contact plug 17b contacts the second interconnect layer 13b. The second contact plug is also connected to the second interconnect layer on the large pattern portion.

Thus, in the thin interconnect area 100, the insulating layer 11a, serving as a core material for sidewall processing, is formed in order to deal with increasingly reduced interconnect intervals. Also in the thick interconnect area 200, the insulating layer 11c, serving as a core material, is formed to allow the interconnect layer 13b to be formed on each sidewall of the insulating layer 11. Thus, a cross section of the interconnect layer 13b which is perpendicular to the direction of electric conduction is larger than the interconnect layer 13d in cross-sectional area, enabling a reduction in interconnect resistance.

Furthermore, the insulating layer 11a is substantially the same as the insulating layer 11c in height, and thus the interconnect layer 13a in the thin interconnect area 100 to which the contact plug is connected is almost equivalent, in height, to the interconnect layer 13c in the thick interconnect area 200 to which the contact plug is connected. As a result, the contact plugs can be simultaneously formed in the thin interconnect area 100 and the thick interconnect area 200.

Moreover, the third area is formed on the first insulating layer 10, is substantially the same as the second insulating layer 11a in height, and comprises the fifth insulating layer 11b formed therein and covered with the fourth insulating layer. Since the additional insulating layer serving as a core material is thus formed in the area 300 in which otherwise substantially no layer is formed, when the insulating layer 15 is formed in the areas 100 to 300, the flatness of the insulating layer 15 can be improved.

As described above, the present embodiment can provide a semiconductor device (interconnects) comprising the thin and thick interconnect areas with the reduced interconnect resistance.

Modification of the First Embodiment

Modification 1

Figure 5:
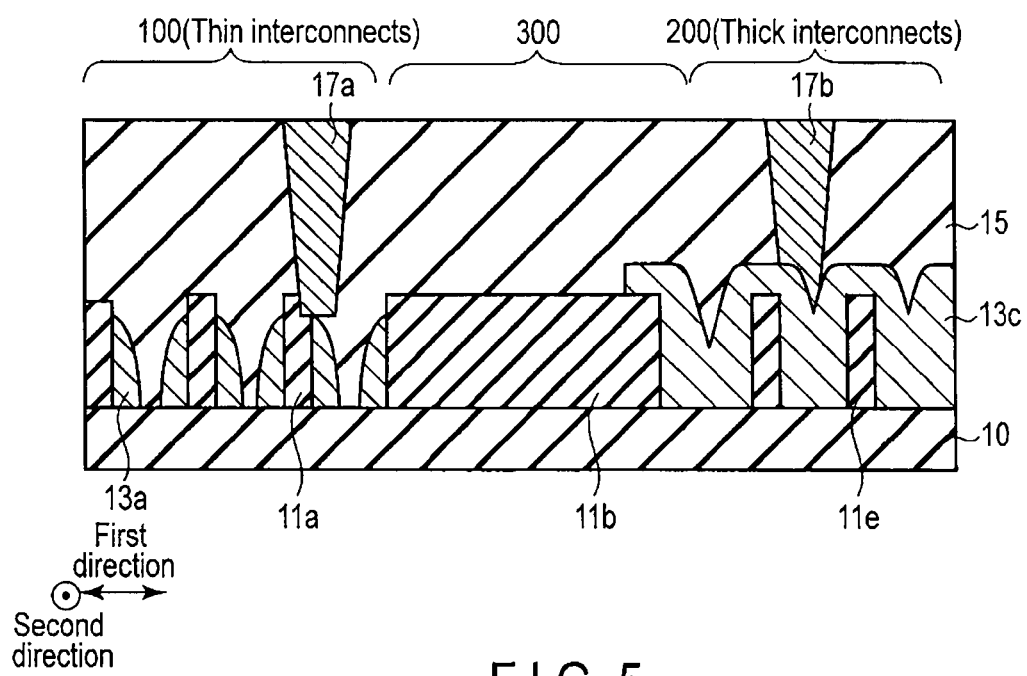
FIG. 5 is a cross-sectional view schematically showing a basic configuration of a semiconductor device according to Modification 1 of the first embodiment.

As shown in FIG. 5, instead of the insulating layer with the large pattern portion 11c, a line-and-space-like insulating layer 11e like the insulating layer in the thin interconnect area 100 may be formed in the thick interconnect area 200. A basic method for manufacturing according to Modification 1 is almost similar to that in the above-described first embodiment, and will not be described in detail. In Modification 1, in the step illustrated in FIG. 2A, the resist 12 in the thick interconnect area 200 has, for example, a line-and-space pattern similar to that of the resist 12a, enabling the insulating layer 11e to be formed.

Even when the fourth insulating layer 11c thus has a line-and-space pattern, compared to the interconnect layer 13d in the comparative example, the interconnect layer 13c in the thick interconnect area 200 can have a sufficient cross-sectional area as is the case with the above-described first embodiment.

Furthermore, in Modification 1, the interconnect layer 13a in the thin interconnect area 100 is almost the same, in height, as the interconnect layer 13b in the thick interconnect area 200 as is the case with the above-described embodiment. Thus, as is the case with the first embodiment, the contact plugs 17a and 17b can be formed more easily than in the comparative example.

Moreover, as is the case with the above-described embodiment, the third area 300 comprises the large pattern portion 11b formed therein and which is the same, in height, as the insulating layers 11a and 11e formed in the areas 100 and 200, respectively. This enables the flatness of top surface of the insulating layer 15 to be restrained from decreasing.

The width and number of insulating layers 11e in the thick interconnect area 200 can be optionally changed. The reduced width and increased number of insulating layers 11e increase the cross-sectional area of the metal film in a cross section, in the direction of electric conduction, of the interconnect layer 13c covering the insulating layer 11e is preferable in connection with suppression of the interconnect resistance.

Variation 2

Figure 6:
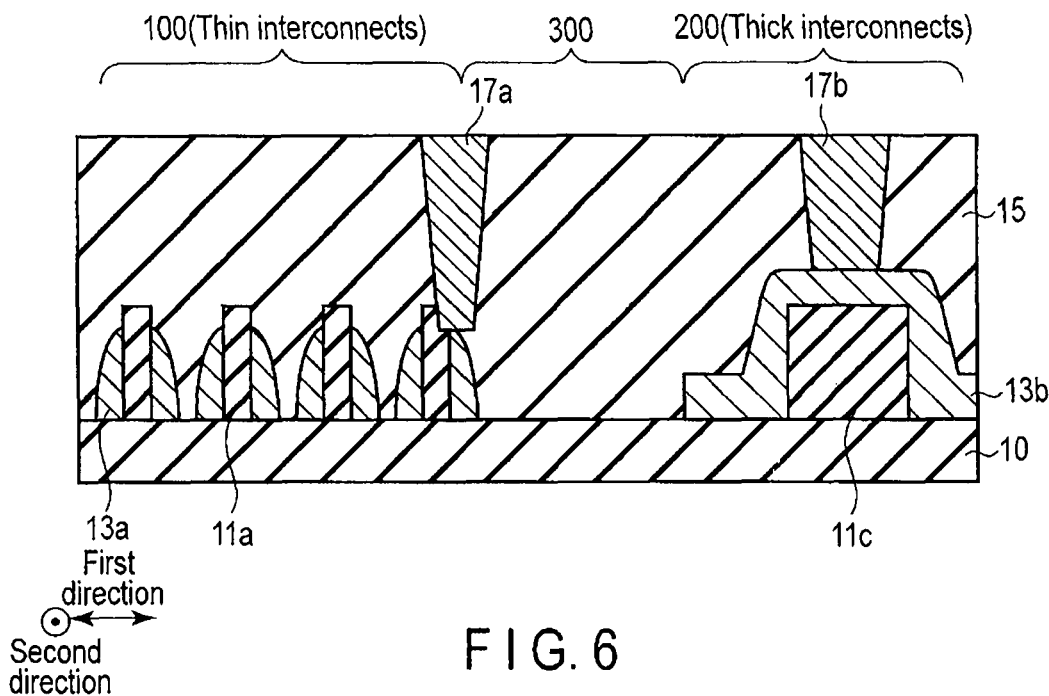
FIG. 6 is a cross-sectional view schematically showing a basic configuration of a semiconductor device according to Modification 2 of the first embodiment.

Now, Modification 2 of the above-described first embodiment will be described with reference to FIG. 6. Modification 2 is different from Modification 1 in that no large-pattern insulating layer is formed in the area 300.

However, compared to the interconnect layer 13d in the comparative example, the interconnect layer 13b in the thick interconnect area 200 can have a sufficient cross-sectional area as is the case with the above-described first embodiment. This allows the resistance of the interconnect layer 13b to be reduced as in the case of the above-described first embodiment.

Furthermore, in Modification 2, the interconnect layer 13a in the thin interconnect area 100 is almost the same, in height, as the interconnect layer 13b in the thick interconnect area 200 as is the case with the above-described embodiment. Hence, as in the case of the first embodiment, the contact plugs 17a and 17b can be formed more easily than in the comparative example.

Modification 3

Figure 7:
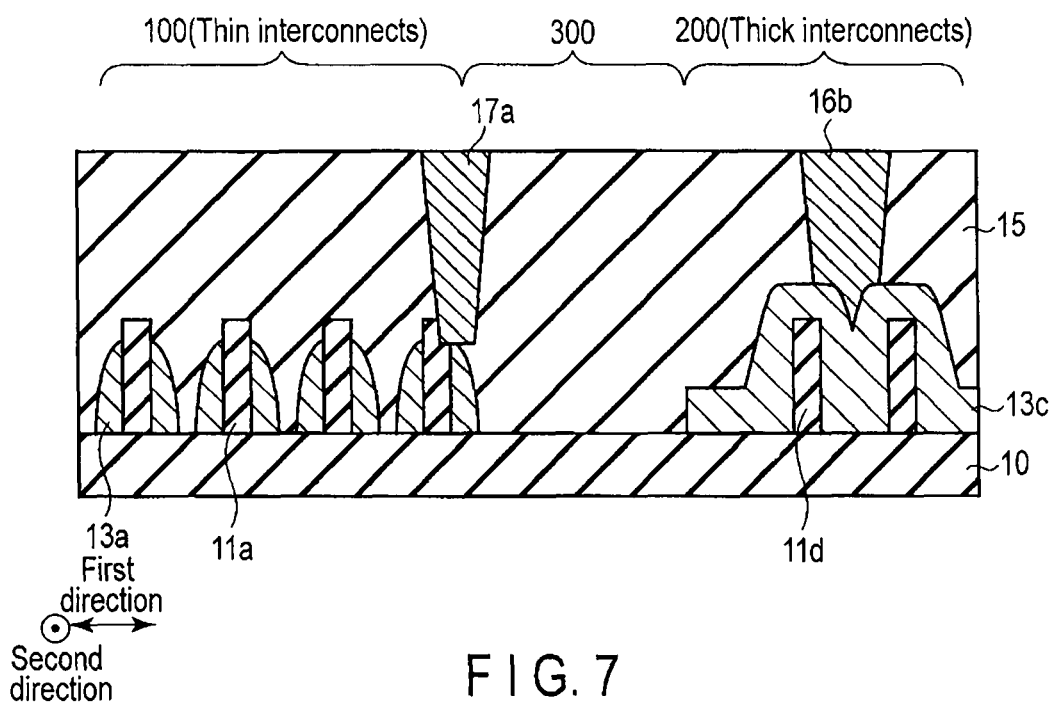
FIG. 7 is a cross-sectional view schematically showing a basic configuration of a semiconductor device according to Modification 3 of the first embodiment.

Now, Modification 3 of the above-described first embodiment will be described with reference to FIG. 7. Modification 3 is different from the first embodiment in that no large-pattern insulating layer is formed in the area 300 and that instead of the insulating layer with the large pattern portion 11c, the thick interconnect area 11e with a line-and-space-like pattern similar to that in the thin interconnect area 100 is formed in the thick interconnect area 200.

Thus, in Modification 1, compared to the interconnect layer 13d in the comparative example, the interconnect layer 13c in the thick interconnect area 200 can have a sufficient cross-sectional area as is the case with the above-described first embodiment. This allows the resistance of the interconnect layer 13c to be reduced as in the case of the above-described first embodiment.

Furthermore, in Modification 2, the interconnect layer 13a in the thin interconnect area 100 is almost the same, in height, as the interconnect layer 13c in the thick interconnect area 200 as is the case with the above-described embodiment.

Hence, as in the case of the first embodiment, the contact plugs 17a and 17b can be formed more easily than in the comparative example.

Figures 8A, 8B, 8C:
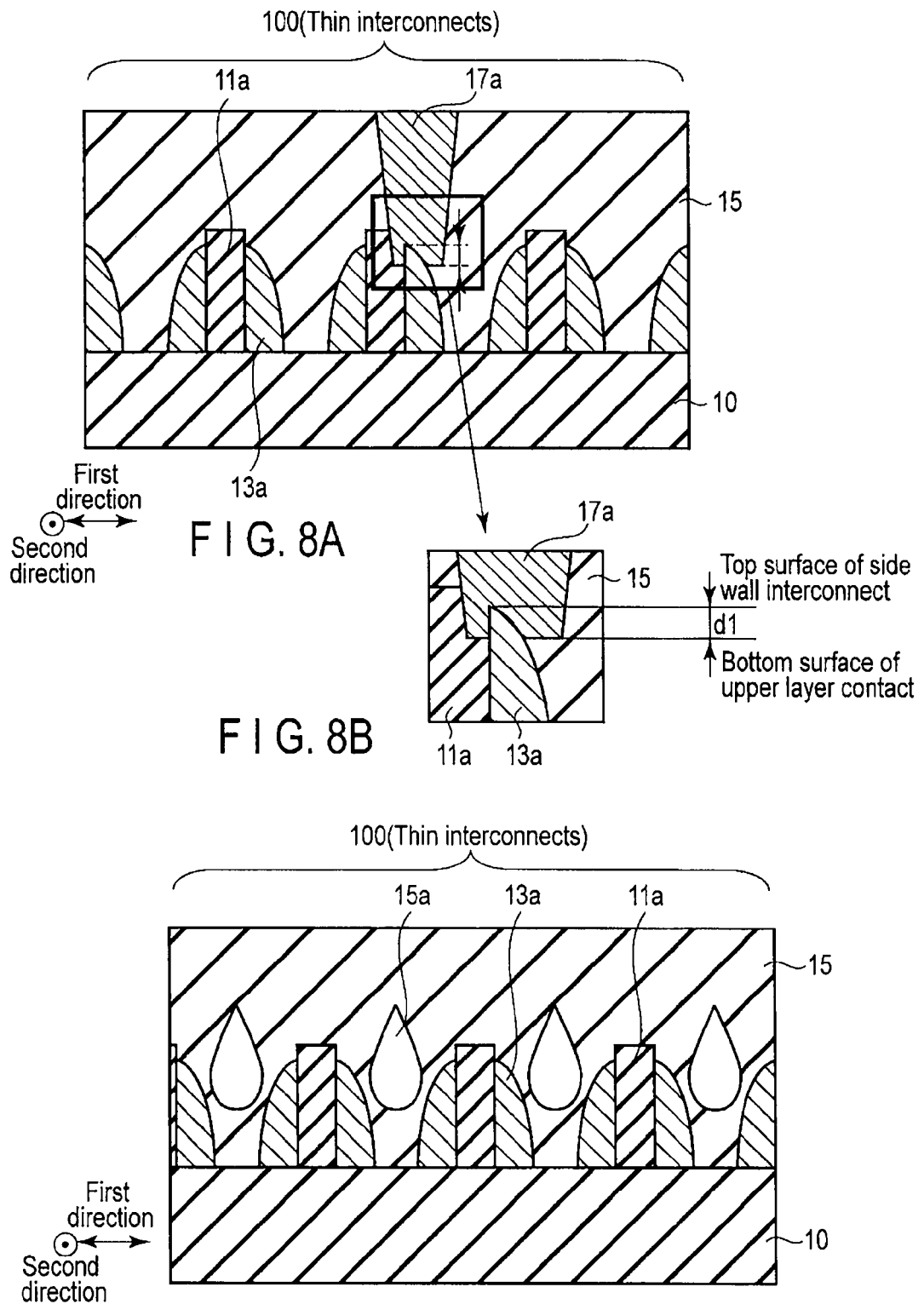
FIG. 8A is a cross-sectional view schematically showing a basic configuration of a semiconductor device according to Modification 4 of the first embodiment.
FIG. 8B is a cross-sectional view clearly illustrating the connection relationship between an upper layer contact and sidewall interconnects.
FIG. 8C is a cross-sectional view schematically showing a basic configuration of a semiconductor device according to Modification 5 of the first embodiment.

As shown in FIG. 8A and FIG. 8B, the area over which the contact plug 17a contacts the sidewall interconnect layer 13a increases consistently with the distance d1 between a bottom surface of the contact plug 17a contacting the sidewall interconnect layer 13a, and a top surface of the sidewall interconnect layer 13a. A method for adjusting d1 is, for example, to adjust etching time when the contact holes 16a and 16b described in the first embodiment described above and shown in FIG. 4 are formed. Contact resistance can be reduced by increasing d1 (increasing the area over which the contact plug 17a contacts the sidewall interconnect area 13a).

Additionally, as shown in FIG. 8C, in the thin interconnect area 100, air gaps 15a may each be formed in the insulating layer 15 between the line-and-space-like sidewall interconnect layers 13a. The air gap can be formed by using a film type that cannot be easily buried and method for film formation involving such a film type. The formation of the air gap 15a between the sidewall interconnect layers 13a enables a reduction in inter-interconnect capacitance.

Second Embodiment

Now, a basic configuration of a semiconductor device according to a second embodiment will be described in brief with reference to FIG. 9. The second embodiment corresponds to the interconnects according to the above-described first embodiment applied to, for example, a nonvolatile memory.

<Configuration of the Semiconductor Device According to The Second Embodiment>

As shown in FIG. 9, the semiconductor device (semiconductor storage device) according to the second embodiment comprises a thin interconnect area 100, a thick interconnect area 200, and an area 300. The semiconductor device according to the second embodiment is also divided into a transistor area 400 in which various transistors including memory cell transistors are formed and an interconnect area 500 in which interconnects are formed. The interconnect area 500 is similar to that in the above-described first embodiment and modifications and will thus not be described in detail.

In the thin interconnect area 100 in the transistor area 400, for example, a plurality of striped element areas AA extending in a second direction are formed on a semiconductor substrate (silicon substrate) 20 along the second direction. Shallow trench isolations (STIs) 21 are each formed between the adjacent element areas to electrically separate the element areas AA from each other. Striped word lines WL (not shown in the drawings) and select gate lines SGD and SGS (not shown in the drawings) extending in a first direction orthogonal to the second direction are formed on the semiconductor substrate 20 so as to stride the plurality of element areas AA. Charge accumulating insulating films (not shown in the drawings) are provided in the respective areas where the word lines WL intersect the element areas AA. Memory cell transistors MT (not shown in the drawings) are provided in the respective areas where the word lines WL intersect the element areas AA. Select transistors ST (not shown in the drawings) are provided in the respective areas where the select gate lines SGD and SGS intersect the element areas AA. An impurity diffusion layer forming a source area or a drain area of the memory cell transistor MT and the select transistor ST is formed in the element area AA between the adjacent word lines WL, between the adjacent select gate lines in the second direction, and between the word line WL and the select gate line, in the second direction.

The impurity diffusion layer formed in the element area AA between the select gate lines SGD adjacent to each other in the second direction functions as a drain area of the select transistor ST. For example, a contact plug (lower layer plug) 25a is formed on the drain area. In the thin interconnect area 100 in the interconnect area 500, the contact plug 25a is connected to one of striped bit lies BL (interconnect layers 13a) provide along the second direction. The contact plug 25a is provided below the interconnect layer 13a and the insulating layer 11a. In other words, the contact plug 25a is formed so as not to contact the part of the insulating layer 15 between the interconnect layers 13a.

The impurity diffusion layer formed in the element area AA between the select gate lines SGS adjacent to each other in the second direction functions as a source area of the select transistor ST. For example, a contact plug (not shown in the drawings) is formed on the source area. The contact plug is connected to a source line SL (not shown in the drawings). The contact plug 25a is formed on the source area of the select transistor ST. The interconnect layer 13a may be a source line SL.

In the thick interconnect area 200 in the transistor area 400, a pair of a source area and a drain area (first impurity diffusion area) 20a with N- or P-type impurities diffused therein is formed in a surface area of the semiconductor substrate 20 which is enclosed by the shallow trench isolation (not shown in the drawings). The channel area is sandwiched between the source are 20a and the drain area 20a.

Furthermore, for example, a silicon oxide film serving a gate insulating film 22 is formed on the channel area. For example, polysilicon serving as an electrode film 23 is formed on the gate insulating film 22. Additionally, example, polysilicon serving as an electrode film 24 is formed on the electrode film 23. The electrode films 23 and 24 are electrically connected together to form as a gate electrode.

A conductive material serving as a contact plug 25b is formed on the source/drain area 20a. In the thick interconnect area 200 in the interconnect area 500, the contact plug 25b is connected to the interconnect layer 13b.

Furthermore, a conductive material serving as a contact plug 25c is formed on the electrode film 24. In the thick interconnect area 200 in the interconnect area 500, the contact plug 25c is connected to the interconnect layer 13b, different from the interconnect layer to which the contact plug 25b is connected.

<Method for Manufacturing a Semiconductor Device According to the Second Embodiment>

Now, a basic method for manufacturing a semiconductor device according to the second embodiment will be described in brief with reference to FIG. 9 to FIG. 12. A method for forming the transistor area 400 is well known and will thus not be described in detail. Furthermore, a method for forming the interconnect area 500 is similar to that described in the first embodiment and will thus not be described in detail.

First, as shown in FIG. 10, the transistor area 400 described with reference to FIG. 9 is formed using a well-known technique.

Then, as shown in FIG. 11, as is the case with the method described with reference to FIGS. 2A, 2B, 2C, 3A, 3B, and 3C, line-and-space-like slimmed interconnect layers 11a are formed on the insulating layer 10 in the interconnect area 500 and thin interconnect area 100, and an insulating layer with a large pattern portion (insulating layer) 11c and an interconnect portion (insulating layer) 11d (not shown in the drawings) extending in the second direction is formed on the insulating layer 10 in the interconnect area 500 and thick interconnect area 200. Furthermore, a large pattern portion (insulating layer) 11b is formed on the insulating layer 10 in the interconnect area 500 and area 300. An interconnect layer 13 is then formed on the insulating layer 10 and on the top surfaces and sidewalls of the insulating layers 11a, 11b, 11c, and 11d. At this time, the insulating layers 11a are arranged such that the contact plug 25a is provided below the interconnect layer 13 and the insulating layers 11a. Furthermore, the insulating layers 11c are arranged such that each of the contact plugs 25b and 25c is connected to the interconnect layer 13 between the corresponding insulating layers 11c.

Then, as shown in FIG. 12, as is the case with the method described with reference to FIGS. 3B and 3C, in the thin interconnect area 100, the interconnect layer 13 is etched back by RIE or the like to form line-and-space-like interconnect layers 13a on the respective sidewalls of the insulating layer 11a. Furthermore, in the thick interconnect area 200, the portions of the interconnect layer 13 to which the contact plugs 25b and 25c are connected are partly patterned so as to electrically separate the contact plugs 25b and 25c from each other.

Then, such a method as described with reference to FIGS. 4 and 1 is carried out to enable a configuration shown in FIG. 9 to be obtained.

<Operations and Effects of the Semiconductor Device According to the Second Embodiment>

According to the above-described second embodiment, the interconnect structures according to the above-described first embodiment and modifications can be adapted for a nonvolatile memory.

If the contact plug 25a avoids being provided below the interconnect layer 13 and the insulating layer 11a as shown in FIGS. 15A and 15B, then during etch-back of the interconnect layer 13, the contact plug 25a may be partly exposed and the exposed portion may be etched. Thus, the etched portion of the contact plug 25a may be damaged.

However, the contact plug 25a according to the second embodiment is provided below the interconnect layer 13a and the insulating layer 11a. Thus, the contact plug 25a is prevented from being exposed when the interconnect layer 13 is etched back to form the sidewall interconnect layer 13a. Hence, even during the etch-back of the interconnect layer 13, the contact plug 25a is prevented from being damaged. Therefore, the present embodiment provides an appropriate contact plug 25a Modification The interconnects described above in the embodiments and modifications can be used not only for a nonvolatile memory as described in the second embodiment and shown in FIG. 13 but also for a volatile memory (DRAM or the like).

As shown in FIG. 13, a semiconductor device according to a modification of the second embodiment comprises a thin interconnect area 100, a thick interconnect area 200, and an area 300. The semiconductor device according to the modification of the second embodiment is also divided into a transistor area 400 in which various transistors are formed and an interconnect area 500 in which interconnects are formed. The interconnect area 500 is similar to that in the above-described first embodiment and modifications and will thus not be described in detail.

In the thick interconnect area 200 in the transistor area 400, a pair of a source area and a drain area (first impurity diffusion area) 20a with N- or P-type impurities diffused therein is formed in a surface area of a semiconductor substrate 20. A channel area is sandwiched between the source are 20a and the drain area 20a. Furthermore, for example, a silicon oxide film serving a gate insulating film 22 is formed on the channel area. For example, polysilicon serving as an electrode film 23 is formed on the gate insulating film 22. The electrode film 23 functions as a gate electrode.

A conductive material serving as a contact plug 25d is formed on the source/drain area 20a. In the thick interconnect area 200 in the interconnect area 500, the contact plug 25d is connected to an interconnect layer 26a. A contact plug 27a is formed between the interconnect layer 13a and the interconnect layer 26a extended to the thin interconnect area 100 in the interconnect layer 500. In this case, like the contact plug 25a described with reference to FIG. 9, the contact plug 27a is provided below the interconnect layer 13a and the insulating layer 11a.

Furthermore, a conductive material serving as a contact plug 25e is formed on the electrode film 23. In the thick interconnect area 200 in the interconnect area 500, the contact plug 25e is connected to the interconnect layer 26b. A contact plug 27b is also formed between the interconnect layers 26b and 13c.

In this manner, the above-described embodiments and modifications can be adapted for a volatile memory. Thus, the present modification can exert effects similar to those of the above-described embodiments and modifications for reasons similar to those described in conjunction with the embodiments and modifications.

In the above-described embodiments and modifications, the insulating layers 11c, 11d, and 11e, which are substantially the same, in height, as the insulating layer 11a, is formed in the thick interconnect area 200. However, the embodiments are not limited to this configuration but any pattern may be used provided that the insulating layer is substantially the same, in height, as the insulating layer 11a.

Furthermore, in the above-described embodiments, the large pattern insulating layer 11, which serves as a core material, is formed in the area 300. The insulating layer 11b may have any pattern shape provided that the surface of the insulating layer 15, which covers the interconnects, can be kept flat.

Additionally, the direction of extension of the line-and-space-like insulating layer 11e in the thick interconnect area 200 is parallel to the insulating layer 11a in the thin interconnect area 100; the direction of extension is described above in Modifications 1 and 3 of the first embodiment and the modification of the second embodiment. However, the embodiments are not limited to this configuration but the insulating layers 11a and 11e need not necessarily be parallel to each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
    a first insulating layer provided in a first area and in a second area;

line-and-space-like second insulating layers formed on the first insulating layer provided in the first area;

a third insulating layer formed on the first insulating layer provided in the second area and which is substantially identical to the second insulating layers in height;

line shaped first interconnect layers each formed on the first insulating layer provided in the first area and on sidewalls of the second insulating layers, wherein the first interconnect layers comprise a curved corner;

a second interconnect layer formed on the first insulating layer provided in the second area and on a top surface and sidewalls of the third insulating layer;

a fourth insulating layer covering the first insulating layer, the second insulating layers, the first interconnect layers, and the second interconnect layer;

a first contact plug formed in the fourth insulating layer provided in the first area, the first contact plug being connected to the first interconnect layers; and a second contact plug formed in the fourth insulating layer provided in the second area, the second contact plug being connected to the second interconnect layer, and wherein the fourth insulating layer is formed between the first interconnect layers.

2. The device according to claim 1, further comprising a fifth insulating layer formed on the first insulating layer provided in the third area, the fifth insulating layer being substantially identical to the second insulating layers in height and being covered with the fourth insulating layer.

3. The device according to claim 1, wherein the third insulating layer comprises a pattern larger than an area over which the second contact plug contacts the second interconnect layer.

4. The device according to claim 1, wherein a top of the first interconnect layers are positioned lower than a top of the second insulating layers.

5. The device according to claim 1, wherein a top of the first interconnect layers are higher than a bottom of the first contact plug.

6. The device according to claim 1, further comprising a void portion formed in the fourth insulating layer provided in the first area and between the opposite first interconnect layers.

7. The device according to claim 1, wherein the first contact plug is positioned above the third insulating layer.

8. The device according to claim 1, wherein the fourth insulating layer is shaped like a line-and-space.

9. The device according to claim 8, wherein the third insulating layer and the second insulating layers are substantially identical in width.

10. The device according to claim 1, further comprising a third contact plug formed in the first insulating layer provided in the second area, the third contact plug being connected to the second interconnect layer.

11. The device according to claim 1, further comprising a third contact plug formed in the first insulating layer provided in the first area, the third contact plug being positioned below the first interconnect layers and the second insulating layers and connected to the first interconnect layers.

12. The device according to claim 11, further comprising a fifth insulating layer formed on the first insulating layer provided in the third area, the fifth insulating layer being identical to the second insulating layers in height and being covered with the fourth insulating layer.

13. The device according to claim 11, wherein the third insulating layer comprises a pattern larger than an area over which the second contact plug contacts the second interconnect layer.

14. The device according to claim 11, wherein the fourth insulating layer is shaped like a line-and-space.

15. The device according to claim 11, wherein a top of the first interconnect layers are positioned lower than a top of the second insulating layers.

16. The device according to claim 11, further comprising a fourth contact plug formed in the first insulating layer provided in the second area, the fourth contact plug being connected to the second interconnect layer.

* * * * *